US012567837B2

(12) United States Patent
    Watanabe

(10) Patent No.: US 12,567,837 B2
(45) Date of Patent: Mar. 3, 2026

(54) AMPLIFIER CIRCUIT

(71) Applicant: Murata Manufacturing Co., Ltd.,
    Kyoto (JP)

(72) Inventor: Daisuke Watanabe, Kyoto (JP)

(73) Assignee: **MURATA MANUFACTURING CO.,
    LTD.**, Kyoto (JP)

( * ) Notice: Subject to any disclaimer, the term of this
    patent is extended or adjusted under 35
    U.S.C. 154(b) by 464 days.

(21) Appl. No.: 18/332,994

(22) Filed: Jun. 12, 2023

(65) Prior Publication Data

US 2023/0327608 A1      Oct. 12, 2023

Related U.S. Application Data

(63) Continuation of application No.
    PCT/JP2021/045820, filed on Dec. 13, 2021.

(30) Foreign Application Priority Data

Dec. 25, 2020     (JP) ................................. 2020-216193

(51) Int. Cl.
    *H03F 1/26*      (2006.01)
    *H03F 1/56*      (2006.01)
    *H03F 3/24*      (2006.01)
    *H03F 3/68*      (2006.01)
    *H03F 3/72*      (2006.01)

(52) U.S. Cl.
    CPC ................ *H03F 1/26* (2013.01); *H03F 1/56*
    (2013.01); *H03F 3/245* (2013.01); *H03F 3/68*
        (2013.01); *H03F 3/72* (2013.01); *H03F*
    *2200/294* (2013.01); *H03F 2200/451* (2013.01)

(58) Field of Classification Search
    CPC ... H03F 1/26; H03F 1/56; H03F 3/245; H03F
        3/68; H03F 3/72; H03F 2200/294; H03F
                                              2200/451
    USPC ......................................................... 330/296
    See application file for complete search history.

(56) References Cited

U.S. PATENT DOCUMENTS

| | | | |
|---|---|---|---|
| 10,177,722 B2 | 1/2019 | Wang et al. | |
| 10,381,991 B1 | 8/2019 | Sanner et al. | |
| 2007/0184811 A1 | 8/2007 | Ballantyne | |
| 2022/0200545 A1* | 6/2022 | Clara ...................... | H03F 3/245 |

FOREIGN PATENT DOCUMENTS

| | | |
|---|---|---|
| JP | 2544223 Y2 | 8/1997 |
| JP | 2009-526497 A | 7/2009 |
| JP | 2012-170121 A | 9/2012 |

OTHER PUBLICATIONS

International Search Report for PCT/JP2021/045820 dated Mar. 15, 2022.

* cited by examiner

*Primary Examiner* — Hafizur Rahman
(74) *Attorney, Agent, or Firm* — McDonald Hopkins LLC

(57) ABSTRACT

An amplifier circuit includes an amplifier including a common drain or a common collector having variable transconductance, a power distributor connected to an output side of the amplifier, and a switch arranged in series on a bypass path, which branches from a path with which the amplifier is connected to the power distributor, bypasses the power distributor, and is joined to an output of the power distributor. Input impedance (Zin) of the power distributor has a value different from that of output impedance (Zout1) of the power distributor.

19 Claims, 8 Drawing Sheets

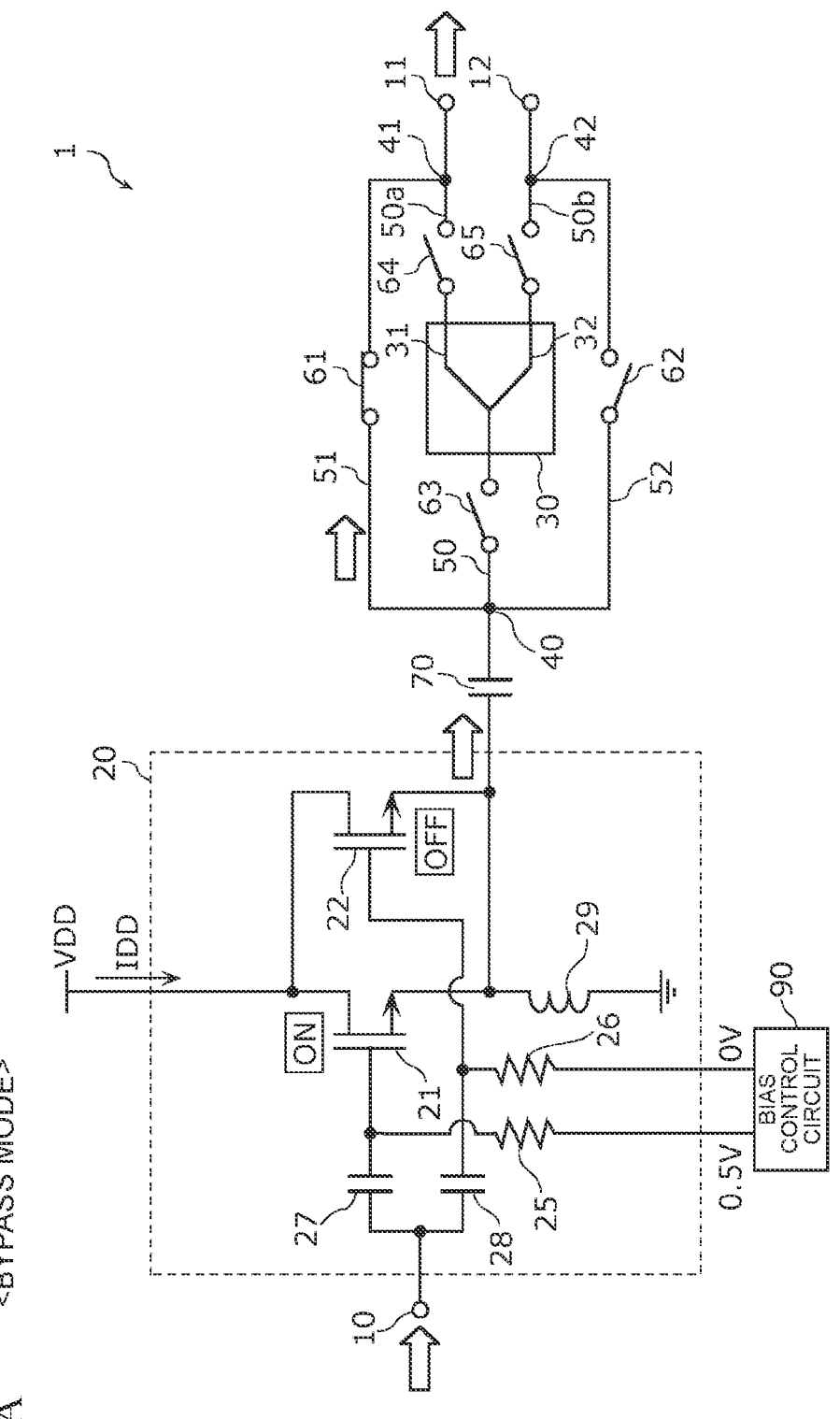
FIG. 2A    <BYPASS MODE>

FIG. 2B    <POWER DISTRIBUTION MODE>
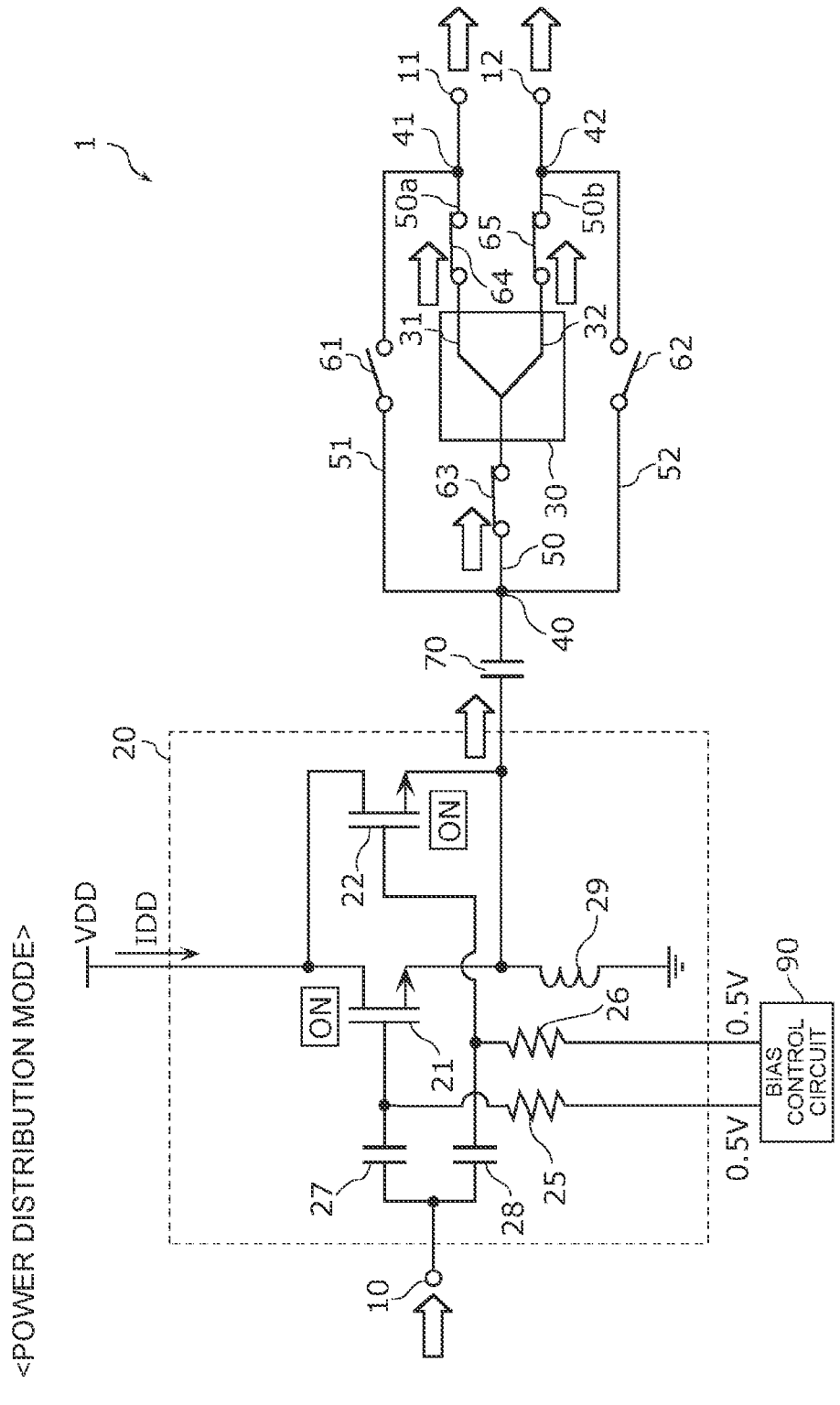

AMPLIFIER CIRCUIT

CROSS REFERENCE TO RELATED APPLICATION

This is a continuation of International Application No. PCT/JP2021/045820 filed on Dec. 13, 2021 which claims priority from Japanese Patent Application No. 2020-216193 filed on Dec. 25, 2020. The contents of these applications are incorporated herein by reference in their entireties.

BACKGROUND ART

Technical Field

The present disclosure relates to an amplifier circuit.

Patent Document 1 discloses a receiver module including a low noise amplifier, a power distributor that distributes a radio-frequency signal amplified by the low noise amplifier, and a high-performance receiver. In the receiver module disclosed in Patent Document 1, a switch is provided on a path with which the low noise amplifier is directly connected to the high-performance receiver. The low noise amplifier is directly connected to the high-performance receiver when the switch is closed while the low noise amplifier is connected to the high-performance receiver via the power distributor when the switch is opened.

Patent Document 1: Japanese Unexamined Patent Application Publication No. 2012-170121

BRIEF SUMMARY

In distribution of a signal using the power distributor, attenuation of the signal occurs. Accordingly, in the receiver module in related art, the gain of the low noise amplifier when the power distributor is used may be varied from that of the low noise amplifier when the power distributor is not used.

In order to resolve the above problem, the present disclosure provides an amplifier circuit capable of suppressing variation in gain.

An amplifier circuit according to an aspect of the present disclosure includes a first amplifier including a common drain or a common collector having variable transconductance; a power distributor connected to an output side of the first amplifier; and a first switch arranged in series on a second path, which branches from a first path with which the first amplifier is connected to the power distributor, bypasses the power distributor, and is joined to an output of the power distributor. Input impedance of the power distributor has a value different from that of output impedance of the power distributor.

An amplifier circuit according to another aspect of the present disclosure includes a first amplifier including a common drain or a common collector; a power distributor connected to an output side of the first amplifier; and a first switch arranged in series on a second path, which branches from a first path with which the first amplifier is connected to the power distributor, bypasses the power distributor, and is joined to an output of the power distributor. Input impedance of the power distributor has a value different from that of output impedance of the power distributor. The first amplifier includes multiple transistors. The multiple transistors are multiple field effect transistors in which gates of the transistors are connected to each other, drains thereof are connected to each other, and sources thereof are connected to each other or are multiple bipolar transistors in which bases of the transistors are connected to each other, collectors thereof are connected to each other, and emitters thereof are connected to each other. A transistor used for amplification is selected from the multiple transistors.

According to the amplifier circuit according to present disclosure, it is possible to suppress variation in gain.

BRIEF DESCRIPTION OF THE DRAWINGS

FIG. 2A is a circuit diagram of the amplifier circuit according to the embodiment in a bypass mode.

FIG. 2B is a circuit diagram of the amplifier circuit according to the embodiment in a power distribution mode.

DETAILED DESCRIPTION

Figure 1:
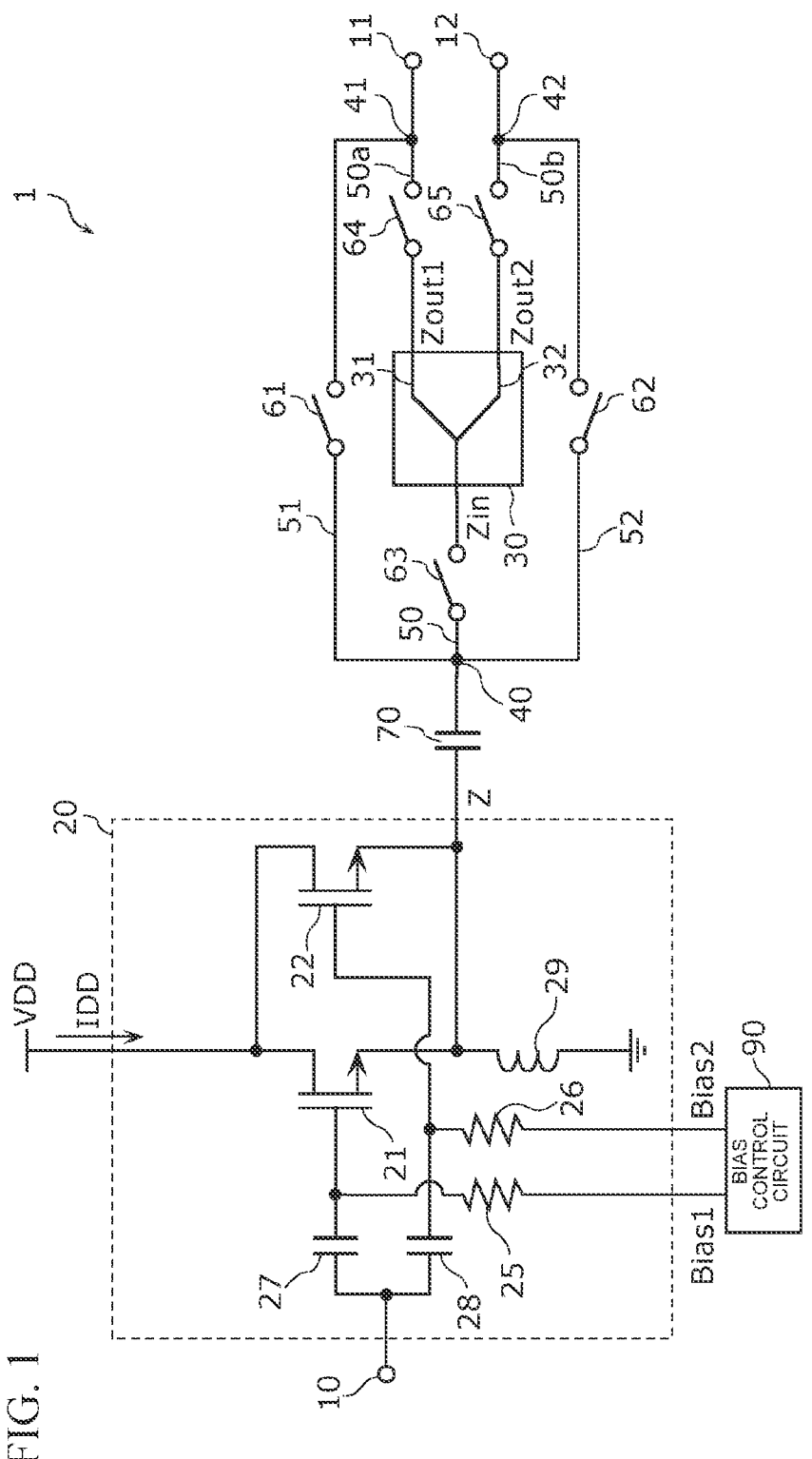
FIG. 1 is a circuit diagram of an amplifier circuit according to an embodiment.

Amplifier circuits according to embodiments of the present disclosure will herein be described in detail with reference to the drawings. All the embodiments described below indicate specific examples of the present disclosure. Accordingly, numerical values, shapes, materials, components, the arrangement of the components, the connection mode of the components, steps, the order of the steps, and so on, which are indicated in the embodiments described below, are only examples and are not intended to limit the present disclosure. Among components in the embodiments described below, components that are not described in the independent claims are described as arbitrary components.

The respective drawings are schematic diagrams and are not necessarily strictly illustrated. Accordingly, for example, the scales and so on in the respective drawings do not necessarily coincide with each other. The same reference numerals and letters are used in the respective drawings to identify substantially the same components and a duplicated description of such components is omitted or simplified.

In this description, terms, such as coincident or equal, indicating the relationship between elements; terms indicating the shapes of the elements; and numerical ranges do not represent only strict meanings but mean inclusion of substantially the same ranges, for example, differences on the order of few percent.

In this description, terms of "upper" and "lower" do not indicate the upper direction (the upper vertical direction) and the lower direction (the lower vertical direction), respectively, in absolute space recognition but are used as terms defined by the relative positional relationship based on the lamination order in a laminated structure. The terms of the "upper" and the "lower" are applied not only to a case in which two components are spaced and another component exists between the two components but also to a case in which two components are in close contact with each other and touch each other.

In this description and the drawings, the x axis, the y axis, and the z axis indicate the three axes in the three-dimensional Cartesian coordinate system. In addition, in this description, a "plan view" means viewing something from a direction orthogonal to main surfaces of a substrate.

In this description, "connected" includes not only direct connection with a connection terminal and/or a wiring conductor but also electrical connection via another circuit element. "Connected between A and B" means connection to both A and B between A and B.

In this description, ordinal numbers, such as "first" and "second", do not mean the number of components or the order of the components but are used to avoid confusion between components of the same type and discriminate the components unless otherwise specified.

Embodiments

1. Configuration of Amplifier Circuit

The configuration of an amplifier circuit according to an embodiment will now be described with reference to FIG. 1.

FIG. 1 is a circuit diagram of an amplifier circuit 1 according to the present embodiment. The amplifier circuit 1 illustrated in FIG. 1 is provided in, for example, a reception circuit that processes a radio-frequency reception signal (hereinafter simply referred to as a radio-frequency signal) received with an antenna. The radio-frequency signal is a signal conforming to communication standards, such as Wi-Fi (registered trademark), Long Term Evolution (LTE), or 5-th Generation (5G). Although the radio-frequency signal is, for example, a signal of a 1-GHz band, a 2.4-GHz band, or a 5-GHz band, the radio-frequency signal is not limited to the signals in these bands.

As illustrated in FIG. 1, the amplifier circuit 1 includes an input terminal 10, two output terminals 11 and 12, an amplifier 20, a power distributor 30, multiple switches 61 to 65, a capacitor 70, and a bias control circuit 90. In addition, the amplifier circuit 1 includes paths 50, 50a, and 50b and two bypass paths 51 and 52.

The input terminal 10 is an input terminal of the amplifier circuit 1. A radio-frequency signal is input into the input terminal 10.

The output terminals 11 and 12 are output terminals of the amplifier circuit 1. The radio-frequency signal that is input into the input terminal 10 and that is amplified by the amplifier 20 is output from at least one of the output terminals 11 and 12. The output terminals 11 and 12 are connected to different signal processing circuits.

The amplifier 20 is an example of a first amplifier including a common drain (a source follower) having variable transconductance. The amplifier 20 is a low noise amplifier that amplifies the radio-frequency signal input into the input terminal 10 and outputs the amplified radio-frequency signal. The radio-frequency signal amplified by the amplifier 20 is output from at least one of the output terminals 11 and 12 via the power distributor 30 or the bypass path 51 or 52.

In the present embodiment, the amplifier 20 is capable of varying output impedance Z depending on an operation mode of the amplifier circuit 1 (specifically, whether the power distributor 30 is used). Specifically, the amplifier 20 has variable transconductance. Accordingly, the output impedance Z of the amplifier 20 is also variable to increase power gain of the amplifier 20. A specific circuit configuration of the amplifier 20 will be described below.

The power distributor 30 is connected to the output side of the amplifier 20. The power distributor 30 includes two lines 31 and 32 for signal output. The power distributor 30 distributes the radio-frequency signal amplified by the amplifier 20 to two signals and outputs the distributed signals from the respective lines 31 and 32. The two signals distributed by the power distributor 30 are respectively output from the output terminals 11 and 12. Since the input radio-frequency signal is distributed to the two signals to be output in the power distributor 30, the signal power of each of the two output signals is decreased to half (about 3 dB) of the signal power of the input signal.

Input impedance Zin of the power distributor 30 is different from output impedance Zout1 or Zout2 of the power distributor 30. The input impedance Zin is the value of impedance when the power distributor 30 is viewed from a branch point 40. The output impedance Zout1 is the value of impedance when the power distributor 30 is viewed from a junction point 41. The output impedance Zout2 is the value of impedance when the power distributor 30 is viewed from a junction point 42.

In the present embodiment, the input impedance Zin is lower than both of the output impedances Zout1 and Zout2. The input impedance Zin is, for example, less than or equal to half of the output impedance Zout1. The output impedance Zout1 is equal to the output impedance Zout2, which is, for example, 50Ω. In contrast, the input impedance Zin has a value of 10Ω or higher and 25Ω or less and, for example, has a value of 25Ω. The specific value of the input impedance Zin is not limited as long as the input impedance Zin is lower than the output impedances. A specific configuration of the power distributor 30 will be described below.

The path 50 is an example of a first path, with which the amplifier 20 is connected to the power distributor 30. The path 50 is branched into the path 50a and the path 50b by the power distributor 30. The path 50a is a path with which the line 31 of the power distributor 30 is connected to the output terminal 11. The path 50b is a path with which the line 32 of the power distributor 30 is connected to the output terminal 12.

The bypass path 51 is an example of a second path. The bypass path 51 branches from the path 50, bypasses the power distributor 30, and is joined to the path 50a at the output side of the power distributor 30. The bypass path 52 is an example of the second path. The bypass path 52 branches from the path 50, bypasses the power distributor 30, and is joined to the path 50b at the output side of the power distributor 30.

The branch point 40 is a node between the path 50 and the bypass paths 51 and 52. The branch point 40 is a starting point of each of the bypass paths 51 and 52. Although the starting points of the bypass paths 51 and 52 coincides with each other in FIG. 1, the starting point of the bypass path 51 may be different from the starting point of the bypass path 52.

The junction point 41 is a node between the bypass path 51 and the path 50a. The junction point 41 is an end point of the bypass path 51. The junction point 41 may coincide with the output terminal 11.

The junction point 42 is a node between the bypass path 52 and the path 50b. The junction point 42 is an end point of the bypass path 52. The junction point 42 may coincide with the output terminal 12.

The switch 61 is an example of a first switch and is arranged in series on the bypass path 51. The switch 61 switches between conduction and non-conduction of the bypass path 51. The "conduction of a path" means that the radio-frequency signal is capable of passing through the path. The "non-conduction of a path" means that the radio-frequency signal is not capable of passing through the path.

The switch 62 is an example of the first switch and is arranged in series on the bypass path 52. The switch 62 switches between conduction and non-conduction of the bypass path 52.

The switch 63 is arranged in series on the path 50. Specifically, the switch 63 is connected between the branch point 40 and the power distributor 30. The switch 63 switches between conduction and non-conduction of the path 50.

The switch 64 is arranged in series on the path 50a. Specifically, the switch 64 is connected between the line 31 of the power distributor 30 and the junction point 41. The switch 64 switches between conduction and non-conduction of the path 50a.

The switch 65 is arranged in series on the path 50b. Specifically, the switch 65 is connected between the line 32 of the power distributor 30 and the junction point 42. The switch 65 switches between conduction and non-conduction of the path 50b.

Each of the switches 61 to 65 is capable of switching between a conduction state (on) and a non-conduction state (off). The state of each switch is switched depending on the operation mode of the amplifier circuit 1. This will be described in detail below.

The capacitor 70 is arranged in series on the path 50. Specifically, the capacitor 70 is connected to an output of the power distributor 30 and the branch point 40. The capacitor 70 is a DC-cutting capacitor that is provided to block direct-current components of the amplified radio-frequency signal.

The bias control circuit 90 is a circuit to select a transistor used for amplification from multiple transistors included in the amplifier 20. In other words, the bias control circuit 90 selects one or more transistors that are to be operated as amplifier transistors from the multiple transistors. A specific operation of the bias control circuit 90 will be described below along with the configuration of the amplifier 20.

The amplifier circuit 1 does not necessarily include the capacitor 70. Alternatively, instead of the capacitor 70, DC-cutting capacitors may be respectively provided on the bypass path 51, on the bypass path 52, and between the branch point 40 and the power distributor 30.

Each of the paths 50, 50a, and 50b and the bypass paths 51 and 52 is a signal line composed of a wiring, a via, an electrode, a terminal, and/or the like, which is formed of a conductive member made of metal or the like. The input terminal 10 and the output terminals 11 and 12 are terminals, electrodes, or the likes, which are positioned in end portions of the signal lines.

Each of the switches 61 to 65 is realized by a switching element, such as a field effect transistor (FET) or a bipolar transistor. The capacitor 70 may be an individual passive component, such as a chip capacitor, or may be composed of a conductive pattern provided on a substrate.

2. Configuration of Amplifier

Next, the configuration of the amplifier 20 will be described with reference to FIG. 1.

As illustrated in FIG. 1, the amplifier 20 includes transistors 21 and 22. The amplifier 20 further includes resistors 25 and 26, capacitors 27 and 28, and an inductor 29.

The transistors 21 and 22 are FETs and function as the amplifier transistors of the common drain. In other words, each of the transistors 21 and 22 amplifies the radio-frequency signal input into its gate and outputs the amplified radio-frequency signal. Although the FET is, for example, an n-channel metal-oxide-semiconductor field-effect transistor (MOSFET), the FET may be a p-channel MOSFET.

The gate of the transistor 21 is connected to the gate of the transistor 22, the drain of the transistor 21 is connected to the drain of the transistor 22, and the source of the transistor 21 is connected to the source of the transistor 22. Specifically, the gate of the transistor 21 is connected to the input terminal 10 via the capacitor 27. The gate of the transistor 22 is connected to the input terminal 10 via the capacitor 28. In other words, the gates of the respective transistors 21 and 22 are connected to each other via the capacitors 27 and 28. Each of the capacitors 27 and 28 is a DC-cutting capacitor that is provided to block direct-current components of the radio-frequency signal input into the input terminal 10.

The drain of the transistor 21 is connected to the drain of the transistor 22 and power supply voltage VDD is supplied to the drain of the transistor 21 and the drain of the transistor 22. The source of the transistor 21 is connected to the source of the transistor 22 to be connected to one end of the inductor 29. The inductor 29 is provided to adjust the output impedance Z of the amplifier 20. The node between the sources of the transistors 21 and 22 corresponds to an output terminal of the amplifier 20.

Bias voltage is supplied from the bias control circuit 90 to the gate of each of the transistors 21 and 22 via the resistor 25 or 26. Bias voltage Bias1 to be supplied to the gate of the transistor 21 may be equal to or may be different from bias voltage Bias2 to be supplied to the gate of the transistor 22. In the present embodiment, at least one of the bias voltages Bias1 and Bias2 is variable.

The bias control circuit 90 supplies the bias voltage Bias1 to the gate of the transistor 21 and supplies the bias voltage Bias2 to the gate of the transistor 22. In the present embodiment, the bias control circuit 90 varies the magnitude of the bias voltage Bias2 depending on the operation mode of the amplifier circuit 1. Specifically, the bias control circuit 90 is capable of varying the value of the bias voltage Bias2 to a first value at which the transistor 22 is operated for amplification and a second value at which the transistor 22 is not operated.

For example, when the bias control circuit 90 supplies 0.5 V as the bias voltage Bias2, the transistor 22 is capable of being operated as the amplifier transistor. When the bias control circuit 90 supplies 0 V as the bias voltage Bias2, the transistor 22 is not operated as the amplifier transistor. The magnitudes of the bias voltage Bias2 indicated here are only examples and are not limited the above values.

The configuration of the amplifier 20 is not limited to the example illustrated in FIG. 1. For example, the amplifier 20 does not necessarily include the resistors 25 and 26, the capacitors 27 and 28, and the inductor 29.

3. Transconductance, Output Impedance, and Power Gain

Next, the relationship between the transconductance, the output impedance, and the power gain of the amplifier 20 will be described.

In the present embodiment, the magnitude of the bias voltage Bias2 supplied from the bias control circuit 90 is varied to switch between turning-on and turning-off of the operation of the transistor 22. This enables the transconductance, the output impedance, and the power gain of the amplifier 20 to be varied. Since the gate of the transistor 21 is connected to the gate of the transistor 22, the drain of the transistor 21 is connected to the drain of the transistor 22, and the source of the transistor 21 is connected to the source of the transistor 22 in the amplifier 20, the transconductance of the amplifier 20 is the sum of the transconductances of the transistors that are being operated, among the two transistors 21 and 22.

For example, when only the transistor 21 is being operated, the transconductance of the amplifier 20 is equal to the transconductance of the transistor 21. When the transistors 21 and 22 are being operated, the transconductance of the amplifier 20 is the sum of the transconductances of the respective transistors 21 and 22.

For example, drain current ID has the relationship represented by Expression (1) where the channel length of the MOSFET is denoted by L, the channel width of the MOSFET is denoted by W, a threshold voltage is denoted by Vt, and gate-source voltage is denoted by Vgs. The drain current ID is current flowing through the transistor that is being operated, in current IDD supplied from the power supply voltage VDD.

Formula 1

$$ID \propto \frac{W}{L} \cdot (Vgs - Vt)^2 \tag{1}$$

Since transconductance gm is represented by the amount of variation of the drain current ID with respect to the amount of variation of Vgs, that is, $\partial ID/\partial Vgs$, the transconductance gm has the relationship represented by Expression (2):

Formula 2

$$gm \propto \frac{W}{L} \cdot (Vgs - Vt) \tag{2}$$

The transconductance gm has the relationship represented by Expression (3) according to Expressions (1) and (2):

Formula 3

$$gm \propto \sqrt{\frac{W}{L} \cdot ID} \tag{3}$$

In the present embodiment, the transconductance of the transistor 21 is equal to that of the transistor 22. Specifically, the transistors 21 and 22 are the FETs that are made of the same material and that have the same channel length L and the same channel width W. When both of the transistors 21 and 22 are turned on, the transconductance of the amplifier 20 is twice as high as the transconductance of the transistor 21.

In the common drain (the source follower circuit), the output impedance Z is substantially equal to reciprocal of the transconductance gm. In other words, the output impedance Z of the amplifier 20 is represented by Expression (4):

Formula 4

$$Z \approx \frac{1}{gm} \tag{4}$$

Accordingly, varying the value of the transconductance of the amplifier 20 enables the output impedance Z of the amplifier 20 to be varied. Specifically, the output impedance Z of the amplifier 20 is decreased as the transconductance of the amplifier 20 is increased. More specifically, the transconductance of the amplifier 20 is inversely proportional to the output impedance Z, as represented by Expression (4). Consequently, for example, doubling the transconductance gm enables the output impedance Z of the amplifier 20 to be halved.

Power gain Pgain of the amplifier 20 is represented by the ratio of output power Pout with respect to input power Pin, as represented by Equation (5):

Formula 5

$$Pgain = \frac{Pout}{Pin} = \frac{Vout^2/Rout}{Vin^2/Rin} \tag{5}$$

In Equation (5), Rin denotes input resistance (input impedance) of the amplifier 20 and Rout denotes output resistance (the output impedance Z) of the amplifier 20. The power gain (Vout/Vin) is ideally equal to one in the common drain. Accordingly, the power gain Pgain is represented by Equation (6):

Formula 6

$$Pgain = \frac{Rin}{Rout} \tag{6}$$

Since the output resistance Rout is equal to the output impedance Z according to Expression (4) and Equation (6), the power gain Pgain is proportional to the transconductance gm.

Formula 7

$$Pgain \propto gm \tag{7}$$

Accordingly, when the transconductance gm is doubled, the amplifier 20 operates at the doubled power gain. The amplifier 20 is operated at the power gain that is doubled in a power distribution mode in which the power distributor 30 is used although this will be described in detail below. Accordingly, since the signal power that is decreased in the power distributor 30 is capable of being supplemented, it is possible to achieve the gain equivalent to that in a case in which the power distributor 30 is not used.

4. Operations

Next, the operation of the amplifier circuit 1 will be described. The amplifier circuit 1 has two operation modes: a bypass mode and the power distribution mode.

4-1. Bypass Mode

The bypass mode is a mode in which the power distributor 30 is not used. In other words, the radio-frequency signal amplified by the amplifier 20 is not input into the power distributor 30 in the bypass mode. The radio-frequency signal amplified by the amplifier 20 is output from only one of the output terminals 11 and 12 in the bypass mode.

FIG. 2A is a circuit diagram of the amplifier circuit 1 according to the present embodiment in the bypass mode. The flow of the radio-frequency signal is represented using open arrows in FIG. 2A. The same applies to FIG. 2B described below. FIG. 2A illustrates an example in which the radio-frequency signal is output from the output terminal 11.

As illustrated in FIG. 2A, in the bypass mode, the switch 61 is in the conduction state and the switches 62 to 65 are in the non-conduction state. Since setting the switch 61 to the conduction state makes the bypass path 51 conductive, the amplified radio-frequency signal is supplied from the branch point 40 to the junction point 41 through the bypass path 51 and is output from the output terminal 11.

Since setting the switches 62 to 65 to the non-conduction state makes the paths 50, 50a, and 50b and the bypass path 52 non-conductive, the amplified radio-frequency signal is inhibited from entering these paths. Accordingly, it is possible to suppress loss of the signal power of the radio-frequency signal.

In the bypass mode, the output impedance Z of the amplifier 20 is made coincident with the output impedance Zout1 of the power distributor 30. This achieves impedance matching with a circuit (not illustrated) connected to the output terminal 11, as in the case in which the power distributor 30 is used.

Specifically, in the bypass mode, the bias control circuit 90 supplies 0 V as the bias voltage Bias2 not to operate the transistor 22, as illustrated in FIG. 2A. In other words, only the transistor 21 is operated as the amplifier transistor. Accordingly, the transconductance of the amplifier 20 is equal to the transconductance of one transistor 21. At this time, for example, when the output impedance Zout1 of the power distributor 30 is 50Ω, the transconductance gm of the transistor 21 is adjusted so that the output impedance Z of the amplifier 20 is also 50Ω.

When the radio-frequency signal is output from the output terminal 12 in the bypass mode, the switch 62 is in the conduction state and the switches 61 and 63 to 65 are in the non-conduction state. Since setting the switch 62 to the conduction state makes the bypass path 52 conductive, the amplified radio-frequency signal is supplied from the branch point 40 to the junction point 42 through the bypass path 52 and is output from the output terminal 12.

The output impedance Zout2 of the power distributor 30 is equal to the output impedance Zout1 of the power distributor 30. Accordingly, not operating the transistor 22 makes the output impedance Z of the amplifier 20 equal to the output impedance Zout2 of the power distributor 30 to achieve impedance matching with a circuit (not illustrated) connected to the output terminal 12.

In the present embodiment, the switches 61 and 62 are controlled so that both of the switches 61 and 62 are not concurrently in the conduction state. In other words, the switches 61 and 62 may be in a state (the bypass mode) in which one of the switches 61 and 62 is in the conduction state and the other thereof is in the non-conduction state and in a state (the power distribution mode) in which both of the switches 61 and 62 are in the non-conduction state. The amplifier circuit 1 do not necessarily include either one of the bypass paths 51 and 52, and the switch on the path that is not included in the amplifier circuit 1 is not necessarily provided.

4-2. Power Distribution Mode

The power distribution mode is a mode in which the power distributor 30 is used.

FIG. 2B is a circuit diagram of the amplifier circuit 1 according to the present embodiment in the power distribution mode.

As illustrated in FIG. 2B, in the power distribution mode, the switches 63 to 65 are in the conduction state and the switches 61 and 62 are in the non-conduction state. Since setting the switches 63 to 65 to the conduction state makes the paths 50, 50a, and 50b conductive, the amplified radio-frequency signal is distributed by the power distributor 30 and is output from each of the output terminals 11 and 12.

Since setting the switches 61 and 62 to the non-conduction state makes the bypass paths 51 and 52 non-conductive, the amplified radio-frequency signal is inhibited from entering these paths. Accordingly, it is possible to suppress the loss of the signal power of the radio-frequency signal.

In the power distribution mode, the output impedance Z of the amplifier 20 is made coincident with the input impedance Zin of the power distributor 30. This achieves impedance matching between the amplifier 20 and the power distributor 30.

Specifically, in the power distribution mode, the bias control circuit 90 supplies 0.5 V as the bias voltage Bias2 to operate the transistor 22, as illustrated in FIG. 2B. Since this causes both of the transistors 21 and 22 to operate as the amplifier transistors, the transconductance of the amplifier 20 is twice as high as the transconductance gm of one transistor 21. In other words, the transconductance of the amplifier 20 in the power distribution mode is twice as high as the transconductance of the amplifier 20 in the bypass mode. Accordingly, the output impedance Z of the amplifier 20 in the power distribution mode is equal to half the output impedance Z of the amplifier 20 in the bypass mode. For example, when the input impedance Zin of the power distributor 30 is 25Ω, the transconductance of the amplifier 20 is adjusted so that the output impedance Z of the amplifier 20 is also 25Ω. Specifically, the transconductances gm of the transistors 21 and 22 are adjusted so that the ratio of the transconductance of the amplifier 20 in the power distribution mode with respect to the transconductance of the amplifier 20 in the bypass mode is equal to the ratio of the output impedance Zout1 with respect to the input impedance Zin.

As described above, the transconductance of the amplifier 20 in the power distribution mode is twice as high as the transconductance of the amplifier 20 in the bypass mode. In other words, with reference to Expression (7), the power gain of the amplifier 20 in the power distribution mode is twice as high as the power gain of the amplifier 20 in the bypass mode (is increased by about 3 dB). In the power distribution mode, the radio-frequency signal amplified at the doubled gain is input into the power distributor 30 as the input signal. Accordingly, the amount of decrease of the signal power due to the power distributor 30 is supplemented to make the signal power in the power distribution mode equal to the signal power of the radio-frequency signal output from the amplifier 20 in the bypass mode.

Consequently, it is possible to suppress reduction in the signal power output from the amplifier circuit 1 in both the power distribution mode and the bypass mode. In other words, it is possible to suppress the variation in gain of the amplifier circuit 1 regardless of the operation mode of the amplifier circuit 1.

5. Modifications

Next, modifications of the amplifier circuit 1 according to the embodiment will be described. Points different from the embodiment are mainly described below and a description of points common to the embodiment is omitted or simplified.

5-1. First Modification

First, a first modification will be described with reference to FIG. 3.

Figure 3:
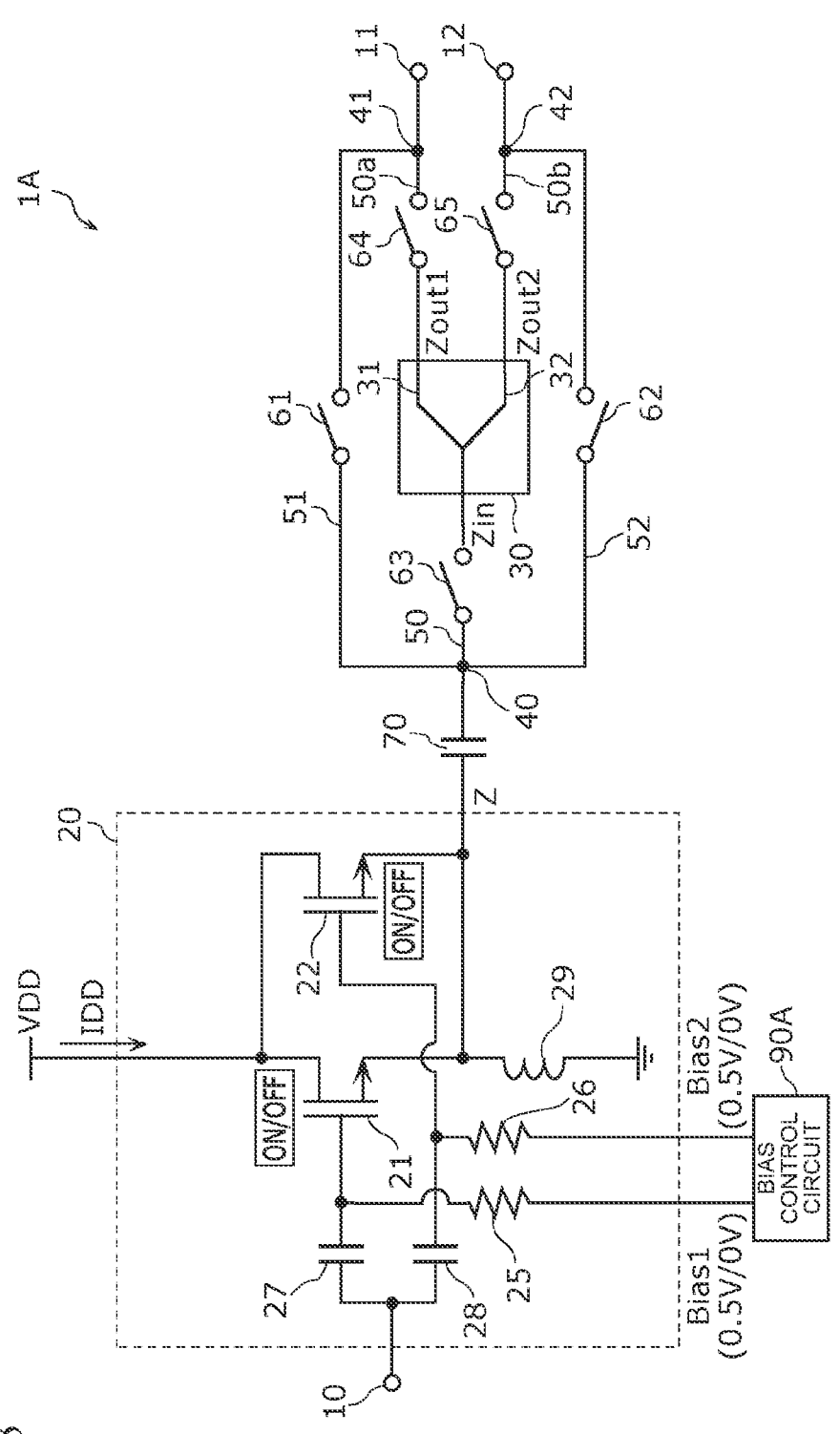
FIG. 3 is a circuit diagram of an amplifier circuit according to a first modification.

FIG. 3 is a circuit diagram of an amplifier circuit 1A according to the first modification. The amplifier circuit 1A illustrated in FIG. 3 includes a bias control circuit 90A, instead of the bias control circuit 90 illustrated in FIG. 1.

The bias control circuit 90A varies both of the bias voltages Bias1 and Bias2. In other words, the bias control circuit 90A switches between turning-on and turning-off of the operation of the transistor 21, in addition to the operation of the transistor 22.

For example, as in the embodiment, the bias control circuit 90A varies the magnitude of each of the bias voltages Bias1 and Bias2 depending on the operation mode of the amplifier circuit 1A. Specifically, the bias control circuit 90A is capable of varying the value of the bias voltage Bias1 to a third value at which the transistor 21 is operated for amplification and a fourth value at which the transistor 21 is not operated. The bias voltage Bias2 is varied in the same manner as in the embodiment.

For example, when the bias control circuit 90A supplies 0.5 V as the bias voltage Bias1, the transistor 21 is capable of being operated as the amplifier transistor. When the bias control circuit 90A supplies 0 V as the bias voltage Bias1, the transistor 21 is not operated as the amplifier transistor. The magnitudes of the bias voltage Bias1 indicated here are only examples and are not limited the above values.

In the present modification, the transconductances of the transistors 21 and 22 are different from each other. For example, the transistors 21 and 22 are different from each other in at least one of the channel length L and the channel width W.

As described above, when the transconductances of the transistors 21 and 22 are different from each other, the value of the transconductance and the value of the output impedance Z of the amplifier 20 are capable of being varied depending on the combination of whether each of the transistors 21 and 22 is operated or is not operated. Specifically, the value of the output impedance Z of the amplifier 20 is capable of being varied between the case in which only the transistor 21 is operated, the case in which only the transistor 22 is operated, and the case in which both of the transistors 21 and 22 are operated.

Accordingly, even if the ratio of the output impedance Zout1 or Zout2 of the power distributor 30 with respect to the input impedance Zin of the power distributor 30 is not two, adjusting the value of the transconductance of each of the transistors 21 and 22 enables the output impedance Z of the amplifier 20 to be set to an appropriate value. In other words, controlling the magnitude of each of the bias voltages Bias1 and Bias2 enables the output impedance Z of the amplifier 20 to be equal to the input impedance Zin and the output impedance Zout1 or Zout2 in both the power distribution mode and the bypass mode.

For example, when the output impedance Zout1 of the power distributor 30 is different from the output impedance Zout2 thereof, the output impedance Z of the amplifier 20 has a different value depending on the path selected in the bypass mode. Even in this case, for example, when the bypass path 51 is conductive in the bypass mode, operating only the transistor 22 enables the output impedance Z of the amplifier 20 to be equal to the output impedance Zout1 of the power distributor 30. When the bypass path 52 is conductive in the bypass mode, operating both of the transistors 21 and 22 enables the output impedance Z of the amplifier 20 to be equal to the output impedance Zout1 of the power distributor 30. When the power distributor 30 is used in the power distribution mode, operating only the transistor 21 enables the output impedance Z of the amplifier 20 to be equal to the input impedance Zin of the power distributor 30. The combinations of the magnitude of the bias voltage to be supplied to each of the transistors 21 and 22 and the value of the output impedance Z of the amplifier 20 are only examples and are not particularly limited.

5-2. Second Modification

Next, a second modification will be described with reference to FIG. 4.

Figure 4:
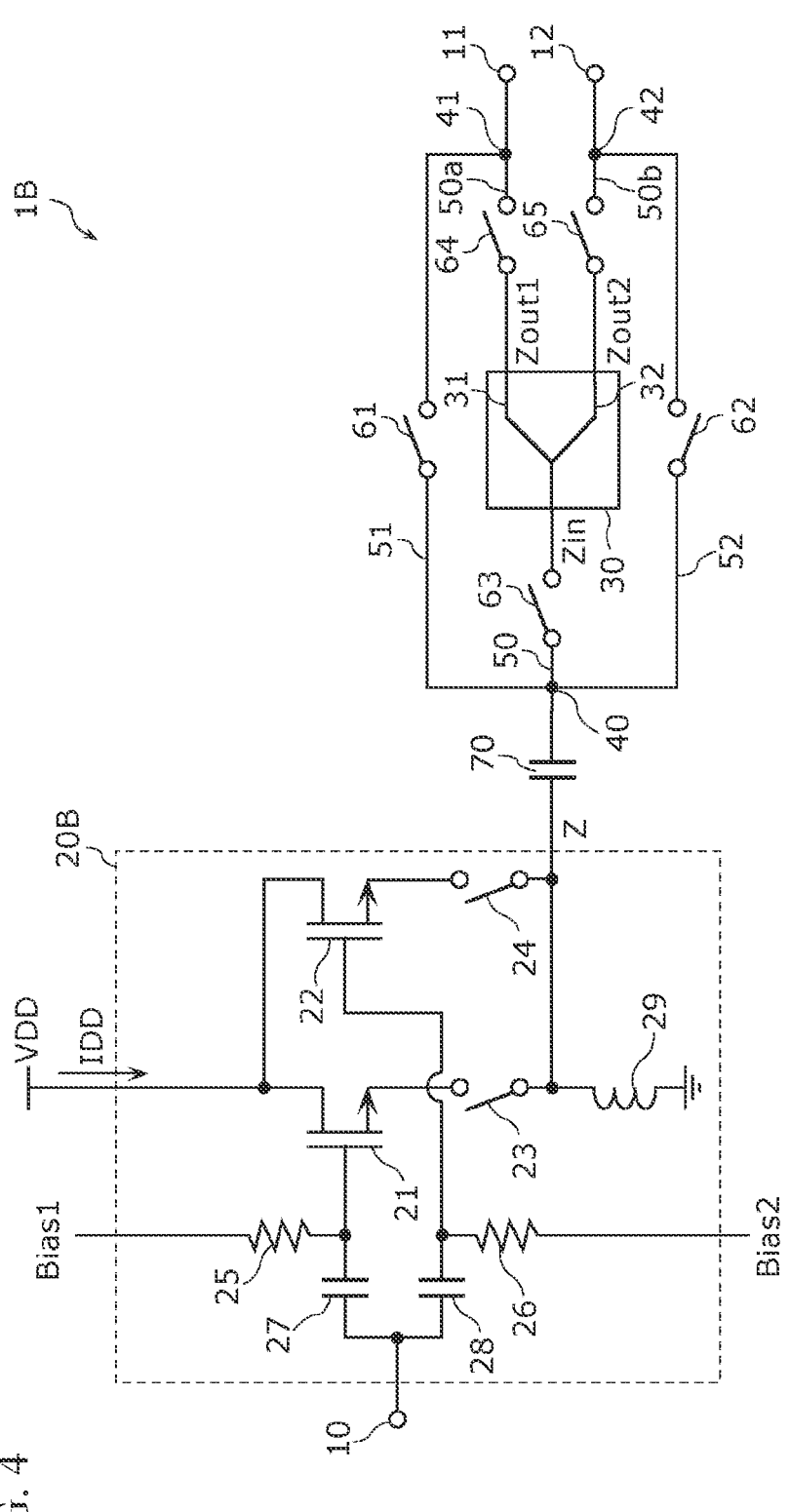
FIG. 4 is a circuit diagram of an amplifier circuit according to a second modification.

FIG. 4 is a circuit diagram of an amplifier circuit 1B according to the second modification. The amplifier circuit 1B illustrated in FIG. 4 includes an amplifier 20B, instead of the amplifier 20 illustrated in FIG. 1. The amplifier 20B further includes switches 23 and 24, in addition to the components in the amplifier 20.

Each of the switches 23 and 24 is an example of a second switch used to select a switch used for amplification from the multiple transistors included in the amplifier 20B. The switch 23 is connected to the source of the transistor 21. The switch 24 is connected to the source of the transistor 22. Each of the switches 23 and 24 is switched between turning-on and turning-off in conjunction with the switches 61 to 65.

For example, a method of using control of the switches 23 and 24 may be adopted as the method of selecting the transistor used for amplification from the transistors 21 and 22.

The switch 23 is a series switch arranged on a path with which the source of the transistor 21 is grounded. The switch 24 is a series switch arranged on a path with which the source of the transistor 22 is grounded. For example, setting the switch 23 to the conduction state (turning on the switch 23) and setting the switch 24 to the non-conduction state (turning off the switch 24) enable the radio-frequency signal to be amplified using the transistor 21. For example, setting the switch 23 to the non-conduction state (turning off the switch 23) and setting the switch 24 to the conduction state (turning on the switch 24) enable the radio-frequency signal to be amplified using the transistor 22. For example, setting both of the switches 23 and 24 to the conduction state (turning on both of the switches 23 and 24) enables the radio-frequency signal to be amplified using both of the transistors 21 and 22.

For example, in the bypass mode, only one of the switches 23 and 24 is in the conduction state and only one of the transistors 21 and 22 is operated as the amplifier transistor. In the power distribution mode, both of the switches 23 and 24 are in the conduction state and both of the transistors 21 and 22 are operated as the amplifier transistors.

As described above, the amplifier circuit 1B according to the present modification further includes the switches 23 and 24 used to select the transistor used for amplification from the multiple transistors. Accordingly, the transistor used for the amplification is selected from the transistors 21 and 22 based on the control of the switches.

The amplifier 20B may include one of the switches 23 and 24 and does not necessarily include the other thereof.

Both the method of using control of the bias voltages described in the embodiment and the method of using control of the switches may be used as the method of selecting the transistor used for amplification from the transistors 21 and 22. For example, when the transistor 21 is used for amplification, the bias voltage Bias1 may be supplied to the gate of the transistor 21 and the switch 23 may be in the conduction state.

Instead of the switch 23 or in addition to the switch 23, a switch may be arranged in series on a path that branches from the path with which the power supply voltage VDD is connected to the drain of the transistor 22 and reaches the drain of the transistor 21. The switch in this case switches between supply and stop of supply of the power supply voltage VDD to the drain of the transistor 21. Accordingly, the switch is capable of switching between turning-on and turning-off of the operation of the transistor 21, like the switch 23.

Alternatively, instead of the switch 23 or in addition to the switch 23, a switch may be arranged in series on a path that branches from the path with which the input terminal 10 is connected to the gate of the transistor 22 and reaches the gate of the transistor 21. The switch in this case switches between input and non-input of the radio-frequency signal into the gate of the transistor 21. Accordingly, the switch is capable of switching between turning-on and turning-off of the operation of the transistor 21, like the switch 23.

Alternatively, instead of the switch 23 or in addition to the switch 23, a switch may be arranged in series on a supply path of the bias voltage Bias1. For example, the switch in this case is connected between the bias control circuit 90 and the resistor 25 and switches between supply and stop of supply of the bias voltage Bias1 to be supplied to the transistor 21. Accordingly, the switch is capable of switching between turning-on and turning-off of the operation of the transistor 21, like the switch 23.

Also for the transistor 22, a switch connected to the drain or the gate of the transistor 22 or a switch arranged in series on a supply path of the bias voltage Bias2 may be provided.

5-3. Third Modification

Next, a third modification will be described with reference to FIG. 5.

Figure 5:
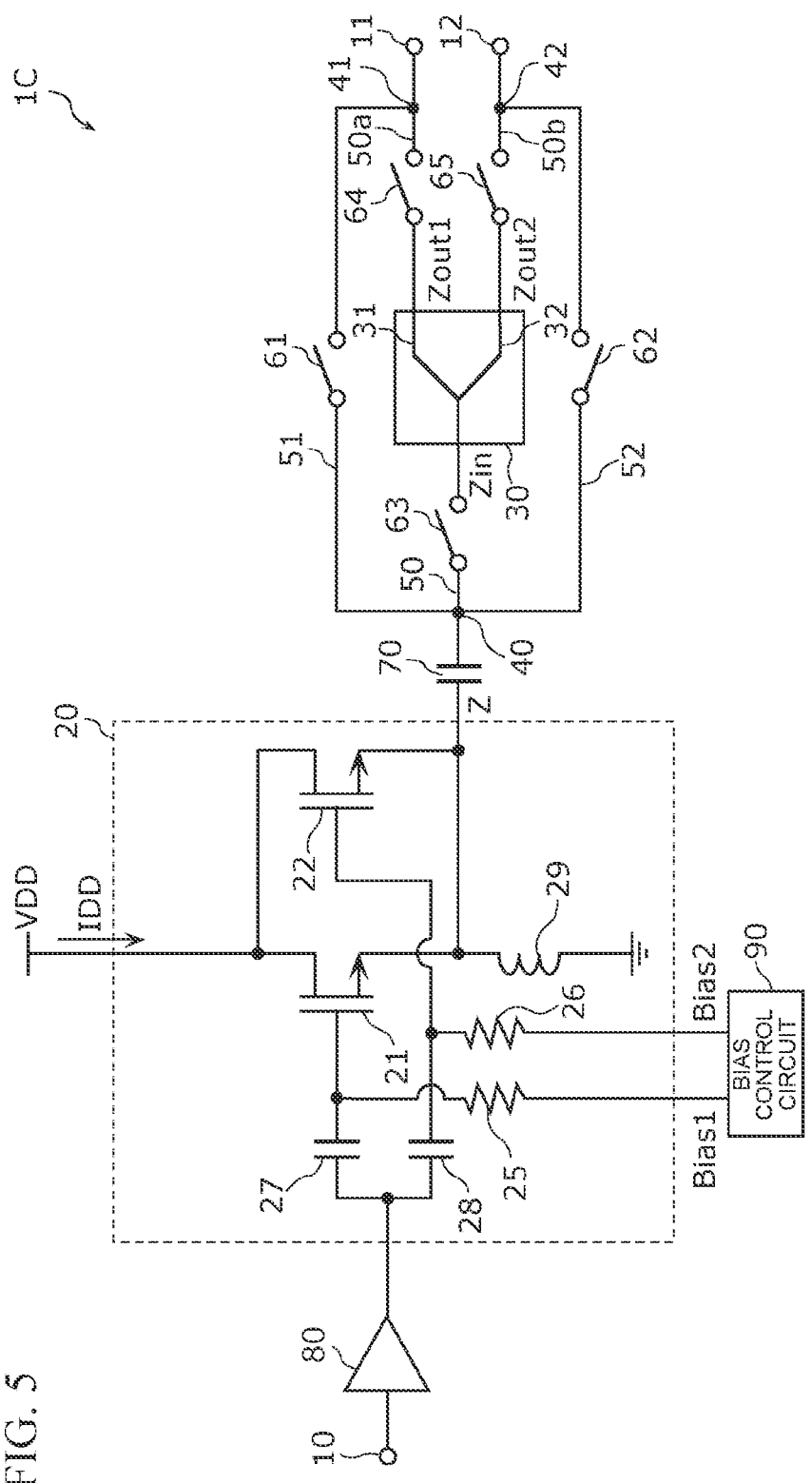
FIG. 5 is a circuit diagram of an amplifier circuit according to a third modification.

FIG. 5 is a circuit diagram of an amplifier circuit 1C according to the third modification. As illustrated in FIG. 5, the amplifier circuit 1C further includes an amplifier 80, in addition to the components in the amplifier circuit 1 illustrated in FIG. 1.

The amplifier 80 is an example of a second amplifier connected to the input side of the amplifier 20. The amplifier 80 is a low noise amplifier that amplifies the radio-frequency signal input into the input terminal 10. The amplifier 80 is, for example, a common source. The amplifier 80 may be a differential amplifier that distributes the input radio-frequency signal into two signals (differential signals) having the same amplitude and opposite phases and amplifies the distributed signals.

As described above, for example, the amplifier circuit 1C includes the amplifier 80 connected to the input side of the amplifier 20.

With the above configuration, it is possible to amplify the radio-frequency signal with noise being sufficiently reduced at the upstream of the amplifier 20. Since the noise is inhibited from being amplified in the amplifier 20, it is possible to realize the amplifier circuit 1C having high accuracy of reception.

6. Configuration of Power Distributor

Next, a specific configuration of the power distributor 30 will be described.

6-1. Circuit Configuration

Figures 6, 7:
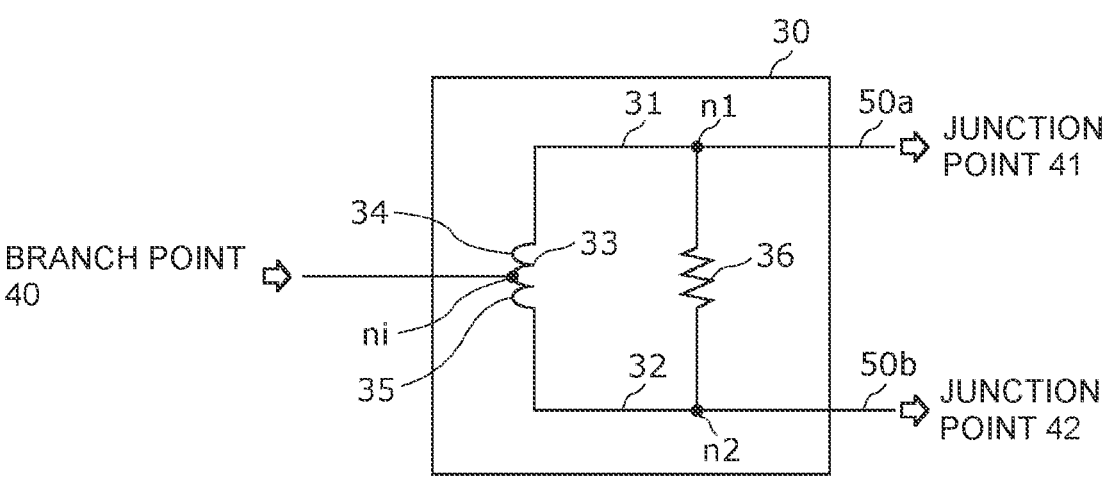
FIG. 6 is a circuit diagram of a power distributor according to the embodiment and each modification.
FIG. 7 is a plan view illustrating the configuration of the power distributor according to the embodiment and each modification.

The circuit configuration of the power distributor 30 will now be described with reference to FIG. 6. FIG. 6 is a circuit diagram of the power distributor 30 according to the embodiment and each modification.

As illustrated in FIG. 6, the power distributor 30 includes lines 31 and 32, a differential inductor 33, and a resistive element 36.

The line 31 is one output line of the power distributor 30. The line 31 is connected to the path 50a to be connected to the output terminal 11 via the switch 64 (refer to FIG. 1) and the junction point 41. The line 32 is another output line of the power distributor 30. The line 32 is connected to the path 50b to be connected to the output terminal 12 via the switch 65 and the junction point 42.

The differential inductor 33 has an input node ni connected to the branch point 40, a coiled first line 34, and a coiled second line 35. The first line 34 and the second line 35 are connected to the input node ni. The coils of the first line 34 and the second line 35 have opposite winding directions, and the first line 34 and the second line 35 have the same coil axis.

One end of the first line 34 is connected to the input node ni and the other end thereof is connected to a node n1 at the output side of the first line 34. The node n1 is a node positioned between an output end of the first line 34 and the path 50a.

One end of the second line 35 is connected to the input node ni and the other end thereof is connected to a node n2 at the output side of the second line 35. The node n2 is a node positioned between an output end of the second line 35 and the path 50b.

The resistive element 36 is arranged between the nodes n1 and n2 and is an element with which the node n1 is connected to the node n2. The resistive element 36 is provided to ensure isolation between the signal to be output to the path 50a and the signal to be output to the path 50b. When the output impedances Zout1 and Zout2 at the nodes n1 and n2, respectively, are 50Ω, the resistance value of the resistive element 36 is set to 100Ω, which is twice as high as 50Ω.

As described above, the power distributor 30 is composed using the differential inductor 33 and the resistive element 36. For example, when the signal is subjected to power distribution using multiple resistive elements, power loss of about 6 dB may occur. In contrast, since the inductor is used in the power distributor 30 of the present embodiment, it is possible to decrease the power loss of the signal in the power distributor 30 to about 3 dB.

6-2. Structure of Power Distributor

Next, the structure of the power distributor 30 will be described. The power distributor 30 is, for example, integrated in an integrated circuit. FIG. 7 is a plan view illustrating the configuration of the power distributor 30 according to the embodiment and each modification. FIG. 7 is a perspective view when the first line 34 and the second line 35 are viewed in a plan view of the power distributor 30 in a laminated direction of each layer described below.

As illustrated in FIG. 7, the first line 34 and the second line 35 of the differential inductor 33 are made of a conductive material.

One end of the first line 34 is connected to the input node ni and the other end thereof is connected to the node n1 positioned at the output side of the first line 34. One end of the second line 35 is connected to the input node ni and the other end thereof is connected to the node n2 positioned at the output side of the second line 35.

The winding direction of the coil of the first line 34 is opposite to the winding direction of the coil of the second line 35, and the first line 34 and the second line 35 have the same coil axis J. When the power distributor 30 is viewed from the direction illustrated in FIG. 7, the first line 34 has the right-handed coil and the second line 35 has the left-handed coil with respect to the coil axis J. For example, the number of turns of the first line 34 and the number of turns of the second line 35 are 2.5. It is sufficient for the numbers of turns of the first line 34 and the second line 35 to be 0.5 or more. The same coil axis J means that it is sufficient to be substantially the same coil axis. The coil axis of the first line 34 and the coil axis of the second line 35 may be shifted due to variation in manufacturing or the like.

Each of the first line 34 and the second line 35 is a planar spiral coil. The outer perimeter of each of the first line 34 and the second line 35 is increased stepwise from the input node ni to the node n1 or the node n2. At least part of the first line 34 and the second line 35 is juxtaposed to each other so as to be parallel to each other. For example, 0th turn to 0.5th turn of the first line 34 are juxtaposed to 0.5th turn to 1st turn of the second line 35 so as to be parallel to each other. 0.5th turn to 1st turn of the second line 35 are juxtaposed to 1st turn to 1.5th turn of the first line 34 so as to be parallel to each other.

The length of a path from the node n1 to the node n2 through the first line 34 and the second line 35 is ½ of wavelength λ. The length of the first line 34 and the length of the second line 35 are equal to each other, which are λ/4. The first line 34 is axisymmetric to the second line 35 with respect to a straight line with which the coil axis J is connected to the input node ni. The first line 34 and the second line 35, which have the above structure, form one coil the winding direction of which is reversed at the input node ni between the nodes n1 and n2.

The resistive element 36 is an element with which the node n1 is connected to the node n2 and is formed of, for example, a polysilicon resistor.

Figures 8A, 8B, 8C:
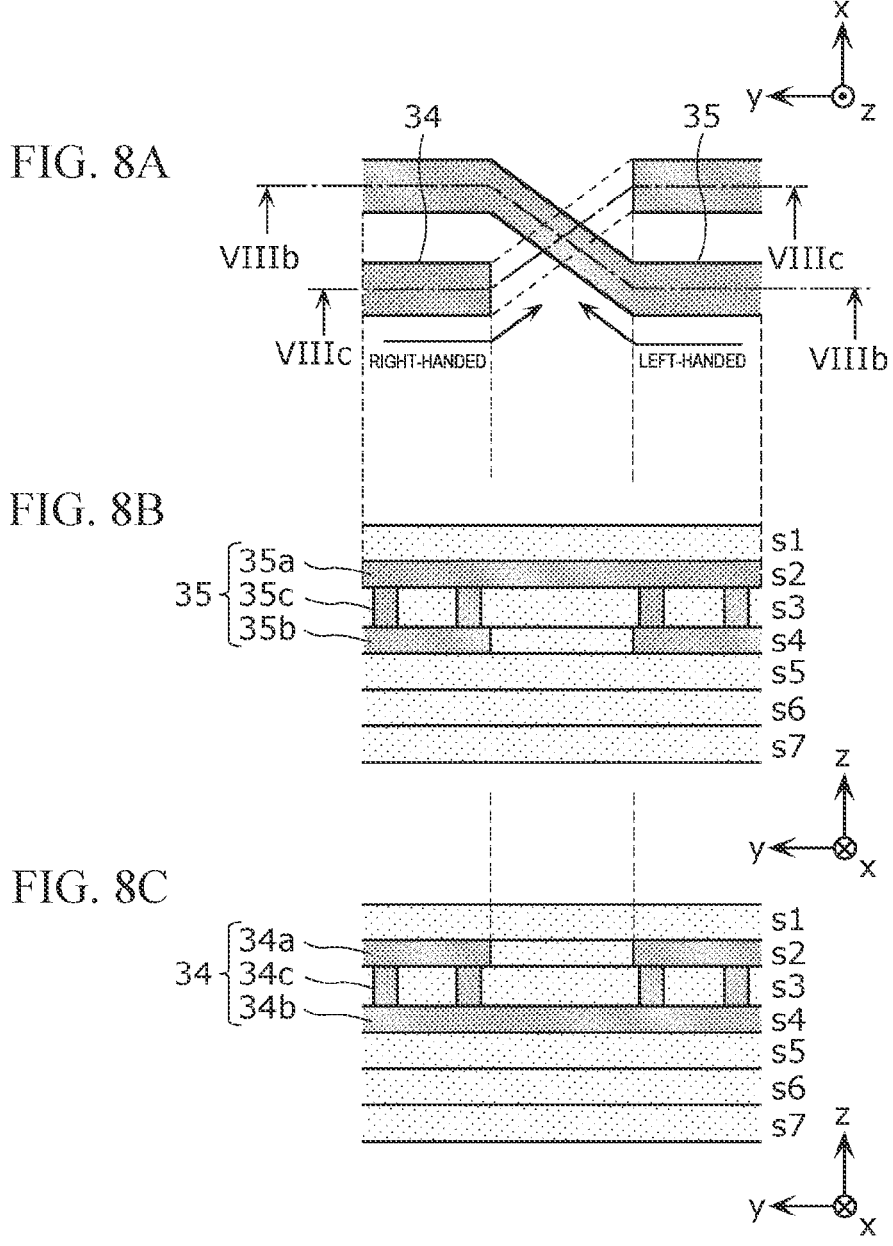
FIG. 8A includes a plan view, and FIGS. 8B and 8C include cross-sectional views illustrating part of the power distributor according to the embodiment and each modification in an enlarged manner.

The structure of a crossing VIIIa at which the first line 34 intersects with the second line 35 will now be described with reference to FIGS. 8A-8C. FIG. 8A includes a plan view and FIGS. 8B and 8C include cross-sectional views illustrating part of the power distributor 30 according to the embodiment and each modification in an enlarged manner. Specifically, FIG. 8A is a plan view illustrating the crossing VIIIa illustrated in FIG. 7 in an enlarged manner. FIG. 8B is a cross-sectional view taken along the VIIIb-VIIIb line in FIG. 8A. FIG. 8C is a cross-sectional view taken along the VIIIc-VIIIc line in FIG. 8A.

As illustrated in FIG. 8B and FIG. 8C, the power distributor 30 is formed, for example, by laminating multiple layers s1, s2, s3, s4, s5, s6, and s7. The respective layers s1 to s7 have a base made of an insulating material. The first line 34 and the second line 35, which are conductive layers, are included in certain layers, among the layers s1 to s7. The input node ni, the nodes n1 and n2, and the resistive element 36 are formed in a layer, which is the same as the layer s6, and are connected to the respective lines positioned in the upper layers.

As illustrated in FIG. 8C, the first line 34 is composed of an upper line 34a included in the layer s2, a lower line 34b included in the layer s4, and a via conductor 34c included in the layer s3. The upper line 34a is connected to the lower line 34b with the via conductor 34c. As illustrated in FIG. 8B, the second line 35 is composed of an upper line 35a included in the layer s2, a lower line 35b included in the layer s4, and a via conductor 35c included in the layer s3. The upper line 35a is connected to the lower line 35b with the via conductor 35c.

Both the first line 34 and the second line 35 have a dual line structure. However, the first line 34 lacks the upper line 34a and is connected only with the lower line 34b at the crossing VIIIa. The second line 35 lacks the lower line 35b and is connected only with the upper line 35a at the crossing VIIIa. Accordingly, the first line 34 intersects with the second line 35 so as not to be in contact with the second line 35 at the crossing VIIIa. The power distributor 30 having the above structure is formed using, for example, a semiconductor process.

For example, in the structure in the related art in which the signal is output via multiple inductors, the area of the power distributor is increased. In contrast, since the coils of the first line 34 and the second line 35 have opposite winding directions and the first line 34 and the second line 35 have the same coil axis in the power distributor 30 of the present embodiment, the first line 34 is capable of being arranged so as to be close to the second line 35. Accordingly, the area of the differential inductor 33 is decreased. As a result, it is possible to reduce the size of the power distributor 30 of the present embodiment, compared with the related art.

The differential inductor 33 is formed so as to have at least one crossing VIIIa at which the first line 34 intersects with the second line 35. Accordingly, the first line 34 is capable of being arranged so as to be close to the second line 35 to further decrease the area of the differential inductor 33. Accordingly, it is possible to further reduce the size of the power distributor 30 of the present embodiment.

7. Effects

As described above, the amplifier circuit 1 according to the present embodiment includes the amplifier 20 including the common drain having variable transconductance, the power distributor 30 connected at the output side of the amplifier 20, and the switch 61 arranged in series on the bypass path 51, which branches from the path 50 with which the amplifier 20 is connected to the power distributor 30, bypasses the power distributor 30, and is joined to the output of the power distributor 30. The input impedance Zin of the power distributor 30 has a value different from that of the output impedance Zout1 of the power distributor 30.

Since the transconductance of the amplifier 20 is variable, as described above, the transconductance is capable of being varied depending on whether the power distributor 30 is used (that is, the operation mode). Accordingly, since the output impedance Z of the amplifier 20 is capable of being varied, the power gain is inhibited from being varied depending on the operation mode. Consequently, it is possible to realize the amplifier circuit 1 having the power gain the variation of which is suppressed.

For example, the impedance Zin is lower than the output impedance Zout1. The transconductance of the amplifier 20 when the switch 61 is in the non-conduction state (the power distribution mode) is higher than that when the switch 61 is in the conduction state (the bypass mode).

With the above configuration, the output impedance Z in the power distribution mode is capable of being made lower than the output impedance in the bypass mode. Since the power gain of the amplifier 20 is increased in the power distribution mode, the signal loss decreased in the power distributor 30 is capable of being supplemented. Accordingly, it is possible to suppress reduction in power gain of the amplifier circuit 1.

The ratio of the transconductance when the switch 61 is in the non-conduction state (the power distribution mode) with respect to the transconductance when the switch 61 is in the conduction state (the bypass mode) is equal to the ratio of the output impedance Zout1 with respect to the input impedance Zin.

With the above configuration, the power gain in the power distribution mode is capable of being equal to the power gain in the bypass mode. Accordingly, it is possible to sufficiently suppress variation in power gain of the amplifier circuit 1.

For example, the amplifier 20 includes the multiple transistors 21 and 22. The multiple transistors 21 and 22 are multiple field effect transistors in which the gates of the transistors 21 and 22 are connected to each other, the drains thereof are connected to each other, and the sources thereof are connected to each other. The transistor used for amplification is selected from the multiple transistors 21 and 22.

With the above configuration, switching between turning-on and turning-off of the multiple transistors enables the transconductance of the amplifier 20 to easily varied.

For example, the amplifier circuit 1 further includes the bias control circuit 90 or 90A that selects the transistor used for amplification from the multiple transistors 21 and 22.

With the above configuration, varying the magnitude of the bias voltage to be supplied enables turning-on and turning-off of each of the transistors 21 and 22 to be easily switched.

For example, the transconductances of the multiple transistors 21 and 22 are equal to each other.

With the above configuration, the transconductance when the operation of one of the two transistors 21 and 22 is stopped is twice as high as the transconductance when both of the transistors 21 and 22 are operated. Since the transconductance is doubled and the output impedance Z is halved in the power distribution mode, it is possible to achieve impedance matching with the power distributor 30 and suppress the reduction in power gain.

For example, as described in the second modification, the switches 23 and 24 are switched between the conduction state and the non-conduction state in conjunction with the switch 61.

With the above configuration, it is possible to vary the transconductance and the power gain of the amplifier 20B depending on the switching of the operation mode.

For example, the power distributor 30 includes the input node ni connected to the branch point 40 of the path 50a and the bypass path 51, the coil-shaped first line 34 and second line 35 connected to the input node ni, and the resistive element 36 with which the node n1 at the output side of the first line 34 is connected to the node n2 at the output side of the second line 35. The first line 34 and the second line 35 are coiled in opposite directions around the same axis.

With the above configuration, it is possible to realize the compact power distributor 30.

OTHERS

Although the amplifier circuit according to the present disclosure is described based on the above embodiment and so on, the present disclosure is not limited to the above embodiment.

For example, although the example is described in each embodiment in which the amplifier 20 or 20B includes the common drain, the amplifier 20 or 20B may include a common collector having variable transconductance. In other words, the two transistors 21 and 22 may be bipolar transistors. In this case, the gate, the drain, and the source of the FET may be replaced with the base, the collector, and the emitter of the bipolar transistor, respectively, in the above description. Specifically, the base of the transistor 21 may be connected to the base of the transistor 22, the collector of the transistor 21 may be connected to the collector of the transistor 22, and the emitter of the transistor 21 may be connected to the emitter of the transistor 22. The bipolar transistor may be an npn bipolar transistor or a pnp bipolar transistor.

In the case of the bipolar transistor, collector current IC is represented by Equation (8) where base-emitter voltage is denoted by Vbe:

Formula 8

$$IC = Is \cdot \left( \exp\left( \frac{qVbe}{kT} \right) - 1 \right) \quad (8)$$

In Equation (8), k denotes Boltzmann constant, T denotes temperature, q denotes elementary charge, and Is denotes reverse saturation current. Since the transconductance gm is represented by the amount of variation of the collector current IC with respect to the amount of variation of Vbe, that is, $\partial IC/\partial Vbe$, the relationship represented by Expression (9) is established:

Formula 9

$$gm \approx \frac{qIC}{kT} \quad (9)$$

For example, the amplifier 20 or 20B may include three or more amplifier transistors. Alternatively, the amplifier 20 or 20B may include only one amplifier transistor. For example, the transconductance of the amplifier 20 or 20B is capable of being varied by varying the bias voltage to one amplifier transistor.

For example, the amplifier 80 according to the second modification may be a common emitter.

For example, the amplifier circuit 1, 1A, 1B, or 1C may be provided in a transmission circuit that processes the radio-frequency transmission signal transmitted from the antenna. The amplifier 20 or 20B may be a power amplifier that amplifies the radio-frequency transmission signal.

For example, the present disclosure may be realized as a reception circuit, a transmission circuit, or a transmission-reception circuit including the amplifier circuit 1, 1A, 1B, or 1C or a front-end module, a communication apparatus, or the like including the reception circuit, the transmission circuit, or the transmission-reception circuit.

Aspects realized by making various modifications supposed by the person skilled in the art to each embodiment and aspects realized by arbitrarily combining the components and the functions in each embodiment without necessarily departing from the spirit and scope of the present disclosure are also included in the present disclosure.

INDUSTRIAL APPLICABILITY

The present disclosure is applicable as an amplifier circuit capable of suppressing the variation in gain of the amplifier and, for example, is applicable to a communication terminal, such as a mobile phone.

REFERENCE SIGNS LIST

1, 1A, 1B, 1C amplifier circuit
10 input terminal
11, 12 output terminal
20, 20B, 80 amplifier
21, 22 transistor
23, 24 switch
25, 26 resistor
27, 28, 70 capacitor
29 inductor
30 power distributor
31, 32 line
33 differential inductor
34 first line
34a, 35a upper line
34b, 35b lower line
34c, 35c via conductor
35 second line
36 resistive element

40 branch point
41, 42 junction point
50, 50*a*, 50*b* path
51, 52 bypass path
61, 62, 63, 64, 65 switch
90, 90A bias control circuit
ni input node
n1, n2 node
s1, s2, s3, s4, s5, s6, s7 layer

The invention claimed is:

1. An amplifier circuit comprising:
a first amplifier comprising a common drain or a common collector, and having variable transconductance;
a power distributor connected to an output of the first amplifier via a first path; and
a first switch connected in series in a second path, the second path branching from the first path, bypassing the power distributor, and connecting to an output of the power distributor,
wherein an input impedance of the power distributor is different than an output impedance of the power distributor.

2. The amplifier circuit according to claim 1,
wherein the input impedance is lower than the output impedance, and
wherein a transconductance when the first switch is in a non-conduction state is higher than when the first switch is in a conduction state.

3. The amplifier circuit according to claim 1, wherein a ratio of the transconductance when the first switch is in the non-conduction state to the transconductance when the first switch is in the conduction state is equal to a ratio of the output impedance to the input impedance.

4. The amplifier circuit according to claim 1,
wherein the first amplifier comprises a plurality of field effect transistors in which gates thereof are connected to each other, drains thereof are connected to each other, and sources thereof are connected to each other, or comprises a plurality of bipolar transistors in which bases thereof are connected to each other, collectors thereof are connected to each other, and emitters thereof are connected to each other, and
wherein a transistor used for amplification is one of the plurality of field effect transistors or one of the plurality of bipolar transistors.

5. The amplifier circuit according to claim 4, further comprising:
a bias control circuit configured to select the transistor used for amplification from the plurality of field effect transistors or the plurality of bipolar transistors.

6. The amplifier circuit according to claim 4, further comprising:
a second switch configured to select the transistor used for amplification from the plurality of field effect transistors or the plurality of bipolar transistors.

7. The amplifier circuit according to claim 6, wherein the first switch is switched between the conduction state and the non-conduction state in conjunction with the second switch.

8. The amplifier circuit according to claim 4, wherein the plurality of field effect transistors or the plurality of bipolar transistors comprises two transistors having equal transconductances.

9. The amplifier circuit according to claim 4, wherein the plurality of field effect transistors or the plurality of bipolar transistors comprises two transistors having different transconductances.

10. The amplifier circuit according to claim 1, further comprising:
a second amplifier connected to an input of the first amplifier.

11. The amplifier circuit according to claim 1,
wherein the power distributor comprises:
an input node connected to a branch point of the first path and the second path,
a coil-shaped first line and second line connected to the input node, and
a resistive element with which a node at an output of the first line is connected to a node at an output of the second line, and
wherein the first line and the second line are coiled in opposite directions around the same axis.

12. An amplifier circuit comprising:
a first amplifier comprising a common drain or a common collector;
a power distributor connected to an output of the first amplifier via a first path; and
a first switch connected in series in a second path, the second path branching from the first path, bypassing the power distributor, and connecting to an output of the power distributor,
wherein an input impedance of the power distributor is different than an output impedance of the power distributor,
wherein the first amplifier comprises a plurality of field effect transistors in which gates thereof are connected to each other, drains thereof are connected to each other, and sources thereof are connected to each other, or comprises a plurality of bipolar transistors in which bases thereof are connected to each other, collectors thereof are connected to each other, and emitters thereof are connected to each other, and
wherein a transistor used for amplification is selected from the plurality of field effect transistors or the plurality of bipolar transistors.

13. The amplifier circuit according to claim 12, further comprising:
a bias control circuit configured to select the transistor used for amplification from the plurality of field effect transistors or the plurality of bipolar transistors.

14. The amplifier circuit according to claim 12, further comprising:
a second switch configured to select the transistor used for amplification from the plurality of field effect transistors or the plurality of bipolar transistors.

15. The amplifier circuit according to claim 14, wherein the first switch is switched between the conduction state and the non-conduction state in conjunction with the second switch.

16. The amplifier circuit according to claim 12, wherein the plurality of field effect transistors or the plurality of bipolar transistors comprises two transistors having equal transconductances.

17. The amplifier circuit according to claim 12, wherein the plurality of field effect transistors or the plurality of bipolar transistors comprises two transistors having different transconductances.

18. The amplifier circuit according to claim 12, further comprising:
a second amplifier connected to an input of the first amplifier.

19. The amplifier circuit according to claim 12,
wherein the power distributor comprises:

an input node connected to a branch point of the first path and the second path, a coil-shaped first line and second line connected to the input node, and a resistive element with which a node at an output of the first line is connected to a node at an output of the second line, and wherein the first line and the second line are coiled in opposite directions around the same axis.

* * * * *